(12) United States Patent
Cheng

(10) Patent No.: US 8,464,144 B2
(45) Date of Patent: Jun. 11, 2013

(54) METHODS FOR LAYOUT ERROR DETECTION

(75) Inventor: Li-Jung Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 393 days.

(21) Appl. No.: 13/015,070

(22) Filed: Jan. 27, 2011

(65) Prior Publication Data

US 2012/0131425 A1    May 24, 2012

(30) Foreign Application Priority Data

Nov. 19, 2010    (TW) .............................. 99140034 A

(51) Int. Cl.
*G06F 11/00*    (2006.01)
*H03M 13/00*    (2006.01)

(52) U.S. Cl.
USPC ........................................................ 714/799

(58) Field of Classification Search
USPC ................... 714/746, 799; 716/55, 112–113
See application file for complete search history.

(56) References Cited

FOREIGN PATENT DOCUMENTS

| TW | 281723 Y | 7/1996 |
|---|---|---|
| TW | I260516 | 8/2006 |
| TW | 201013396 | 4/2010 |

OTHER PUBLICATIONS

Tomordi et al., On the chip implementation of analogic algorithms for optical detection of some layout errors pf printed circuit boards, Apr. 1998, IEEE, p. 162-168.*
Szolgay et al., Optical detection of breaks and short circuits on the layout of printed circuit bords using CNN, Jun. 2006, IEEE, p. 87-92.*

* cited by examiner

*Primary Examiner* — Shelly A Chase
(74) *Attorney, Agent, or Firm* — Morris Manning & Martin LLP; Tim Tingkang Xia, Esq.

(57) ABSTRACT

A layout error detection method includes the following steps, reading a layout file, in which the layout file includes a plurality of elements and a plurality of coordinates, and each element is corresponding to one coordinate; reading a record table, in which the record table includes an identification column, a coordinate column, and a flag column; scanning the layout file to obtain an error detection result, in which the error detection result is corresponding to an identification data and a coordinate data; searching the identification column of the record table to judge whether the identification column has the same identifier according to the identification data, and when a judgment result is false, writing the identification data and the coordinate data of the error detection result, setting a flag value to logic 0, and marking the error detection result; and scanning the layout file repeatedly until all the elements are scanned.

7 Claims, 4 Drawing Sheets

| Identification field | Coordinate field | Flag field |
|---|---|---|
| 001 | (26,24) | 0 |
| 002 | (31,85) | 0 |
|  |  |  |

FIG. 3A

| Identification field | Coordinate field | Flag field |
|---|---|---|
| 001 | (26,24) | 0 |
| 002 | (31,85) | 0 |
| 003 | (12,51) | 0 |

FIG. 3B

| Identification field | Coordinate field | Flag field |
|---|---|---|
| 001 | (26,24) | 1 |
| 002 | (31,85) | 0 |
| 003 | (12,51) | 0 |

FIG. 3C

| Identification field | Coordinate field | Flag field |
|---|---|---|
| 001 | (26,24) | 1 |
| 002 | (17,51) | 0 |
| 003 | (12,51) | 0 |

FIG. 3D

METHODS FOR LAYOUT ERROR DETECTION

CROSS-REFERENCE TO RELATED APPLICATIONS

This non-provisional application claims priority under 35 U.S.C. §119(a) on Patent Application No(s). 099140034 filed in Taiwan, R.O.C. on Nov. 19, 2010, the entire contents of which are hereby incorporated by reference.

BACKGROUND OF THE INVENTION

1. Field of the Invention

The present invention relates to a method for error detection, and more particularly to an error detection method for layout software.

2. Related Art

The layout of a printed circuit board (PCB) greatly influences the performance of a circuit. For example, in a radio frequency circuit, if wires are arranged inappropriately in layout, high-frequency noise is largely increased. In addition, the layout of the circuit board further needs to be designed according to the shape of hardware. That is to say, the layout of the PCB is quite difficult in design.

In the wire layout of the circuit board, computer software is generally used to draw laid out wires. With the promotion of operational capabilities of computers, application functions of the layout software increase day by day.

One of the application functions of the layout software is the function of automatic error detection. The function is to detect whether two adjacent line segments are too close to each other in wire layout. Upon detecting two adjacent wires that are too close to each other, the layout software highlights the wires on a screen, so as to remind the designer to make modification.

However, some errors detected in automatic error detection are within a tolerable range in design. That is to say, these detected errors actually are normal line segments or elements. However, if many errors like this exist, a lot of error messages will be displayed on the screen, thus resulting in disorder of the entire picture displayed by the layout software.

SUMMARY OF THE INVENTION

Accordingly, the present invention is a method of layout error detection, which comprises the following steps.

A layout file is read, in which the layout file comprises a plurality of elements and a plurality of coordinate data, and each element is corresponding to one coordinate data.

A record table is read, in which the record table comprises an identification column, a coordinate column, and a flag column.

The layout file is scanned to obtain an error detection result, in which the error detection result is corresponding to an identification data and a coordinate data.

The identification column of the record table is searched to judge whether the identification column has the same identification data according to the identification data, and when a judgment result is false, the following steps are performed. The identification data of the error detection result is written in the identification column. The coordinate data of the error detection result is written in the coordinate column. A flag value of the flag column corresponding to the error detection result is set to a negative value. The error detection result is marked.

The layout file is scanned repeatedly until all the elements are scanned.

On the other hand, when the judgment result of searching the identification column of the record table to judge whether the identification column has the same identification data is true, the following steps are performed. It is judged whether the flag value of the flag column corresponding to the error detection result is a positive value. When a judgment result is false, the error detection result is marked. When the judgment result is true, the error detection result is hidden.

In addition, it is judged whether a selection signal corresponding to the error detection result is received, and when a judgment result is true, the following steps are performed.

It is judged whether the coordinate data of the element is changed. When a judgment result is true, the changed coordinate data of the error detection result is written in the coordinate column. When the judgment result is false, the coordinate column corresponding to the error detection result is set to a positive value, and the error detection result is hidden.

With the above layout error detection method, error detection results within a tolerable range will be hidden. Therefore, the user will no longer see the marked parts on the picture of the screen, thus increasing the convenience in checking errors by the user.

BRIEF DESCRIPTION OF THE DRAWINGS

The present invention will become more fully understood from the detailed description given herein below for illustration only, and thus are not limitative of the present invention, and wherein:

FIGS. 3A to 3D show an embodiment of the present invention.

DETAILED DESCRIPTION OF THE INVENTION

The detailed features and advantages of the present invention are described below in great detail through the following embodiments, and the content of the detailed description is sufficient for those skilled in the art to understand the technical content of the present invention and to implement the present invention accordingly. Based upon the content of the specification, the claims, and the drawings, those skilled in the art can easily understand the relevant objectives and advantages of the present invention.

The method described below may employ a personal computer or a server for operation and may be implemented by a program, and the steps of the method may be performed by a processor.

Figure 1:
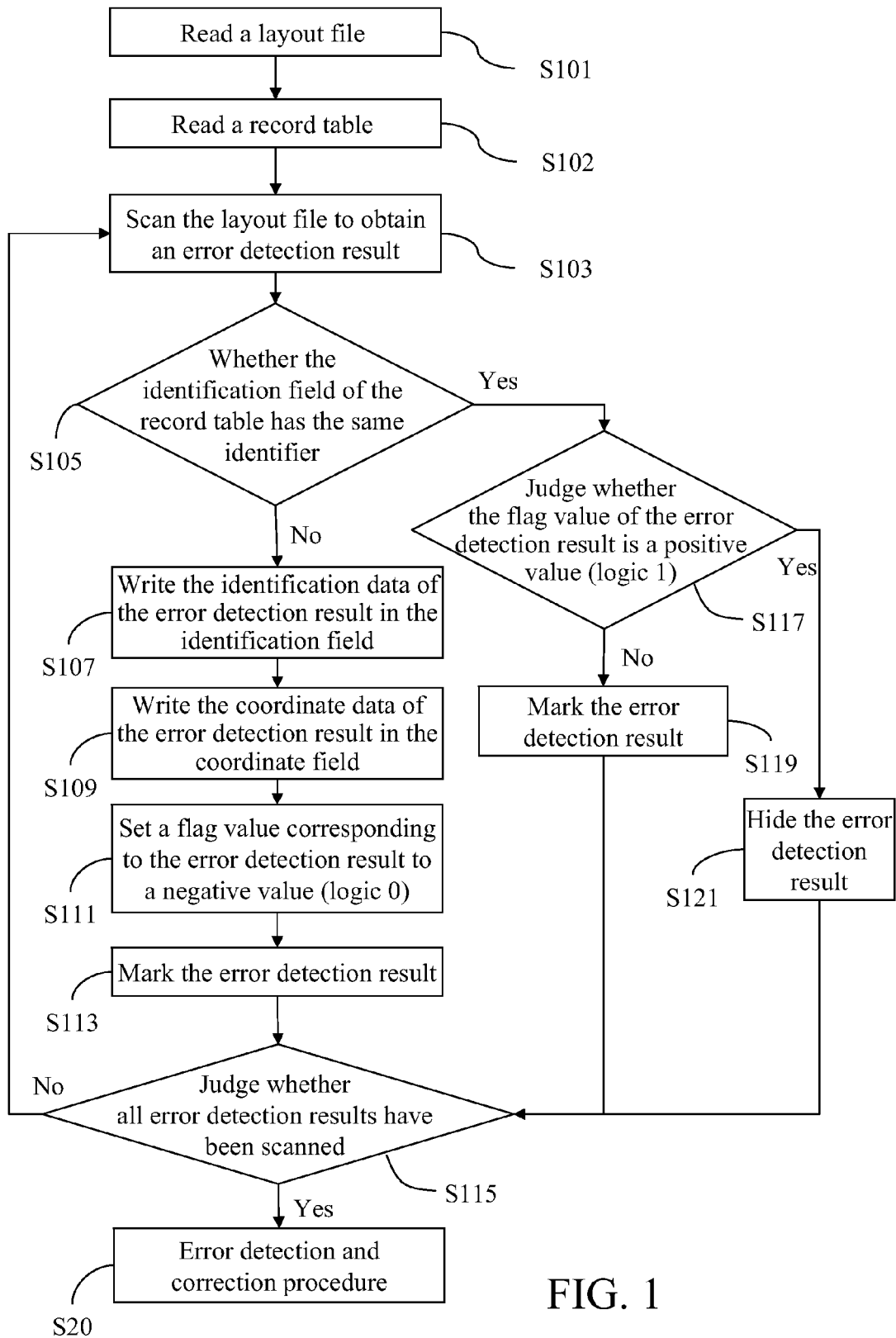
FIG. 1 is a flow chart of a layout error detection method according to the present invention.

Referring to FIG. 1, it is a flow chart of a layout error detection method according to the present invention.

In Step S101, a layout file is read. The layout file comprises a plurality of elements and a plurality of coordinates, and each element is corresponding to one coordinate. That is to say, the elements are one-to-one corresponding to the coordinates. The layout file may be a file that is created in advance.

In Step S102, a record table is read. The record table comprises an identification column, a coordinate column, and a flag column. If the method is performed for the first time, a record table may be created in advance.

In Step S103, the layout file is scanned to obtain an error detection result. The error detection result is corresponding to identification data of an element and coordinate data of the element. In this embodiment, a distance between each element and other elements in the layout file is scanned to judge whether the distance is smaller than a preset value. When it is judged that the distance between the elements is smaller than the preset value, the element corresponds to one error detection result.

In Step S105, the identification column of the record table is searched to judge whether the identification column has the same identifier according to the identification data. If the same identifier already exists in the record table, it represents that the error detection result is not scanned out for the first time. When the identifier that already exists is found in the identification column of the record table, the error detection result has been scanned out in the previous scanning step. On the contrary, when the identifier is not found in the identification column of the record table, it represents that the error detection result is scanned out for the first time.

When the identification result of Step S105 is false, Steps S107, S109, S111, and S113 are performed. In these steps, the identification data and the coordinate data corresponding to the error detection result are stored in the record table, and a flag value is set.

In Step S107, the identification data of the error detection result is written in the identification column.

In Step S109, the coordinate data of the error detection result is written in the coordinate column.

In Step S111, a flag value of the flag column corresponding to the error detection result is set to a negative value (logic 0).

In Step S113, the error detection result may be marked on a screen, so as to remind a designer that an error may occur to the element.

After adding the identification data, the coordinate data, and the flag value of the error detection result, it is judged whether all the elements have been scanned, that is, Step 115 is performed.

In Step S115, it is detected whether any element is not scanned. When it is determined that no other elements that are not scanned exist, it is considered that all the elements have been scanned. When other elements that are not scanned still exist, Step S103 and the subsequent steps are repeated.

Returning to Step S105, when the identification result is true, it represents that an error detection result that is scanned out previously already exists in the record table. At this time, Step S117 is performed next, in which it is determined whether to mark the error detection result on the screen according to data stored in the record table.

In Step S117, it is judged whether the flag value of the error detection result is a positive value (logic 1). When the flag value corresponding to the error detection result is logic 1, it represents that the user considers the error detection result to be within a tolerable range, and has corrected the error detection result. Thus, when the flag value is logic 1, the error detection result is hidden on the screen, that is, Step S121 is performed.

On the contrary, when the flag value is logic 0, the error detection result is marked on the screen, that is, Step S119 is performed.

After Steps S119 and S121 are performed, Step S115 is also performed to determine whether other elements that are not scanned exist.

When the judgment result of Step S115 is true, that is, all the elements have been scanned, an error detection and correction procedure S20 is performed.

Figure 2:
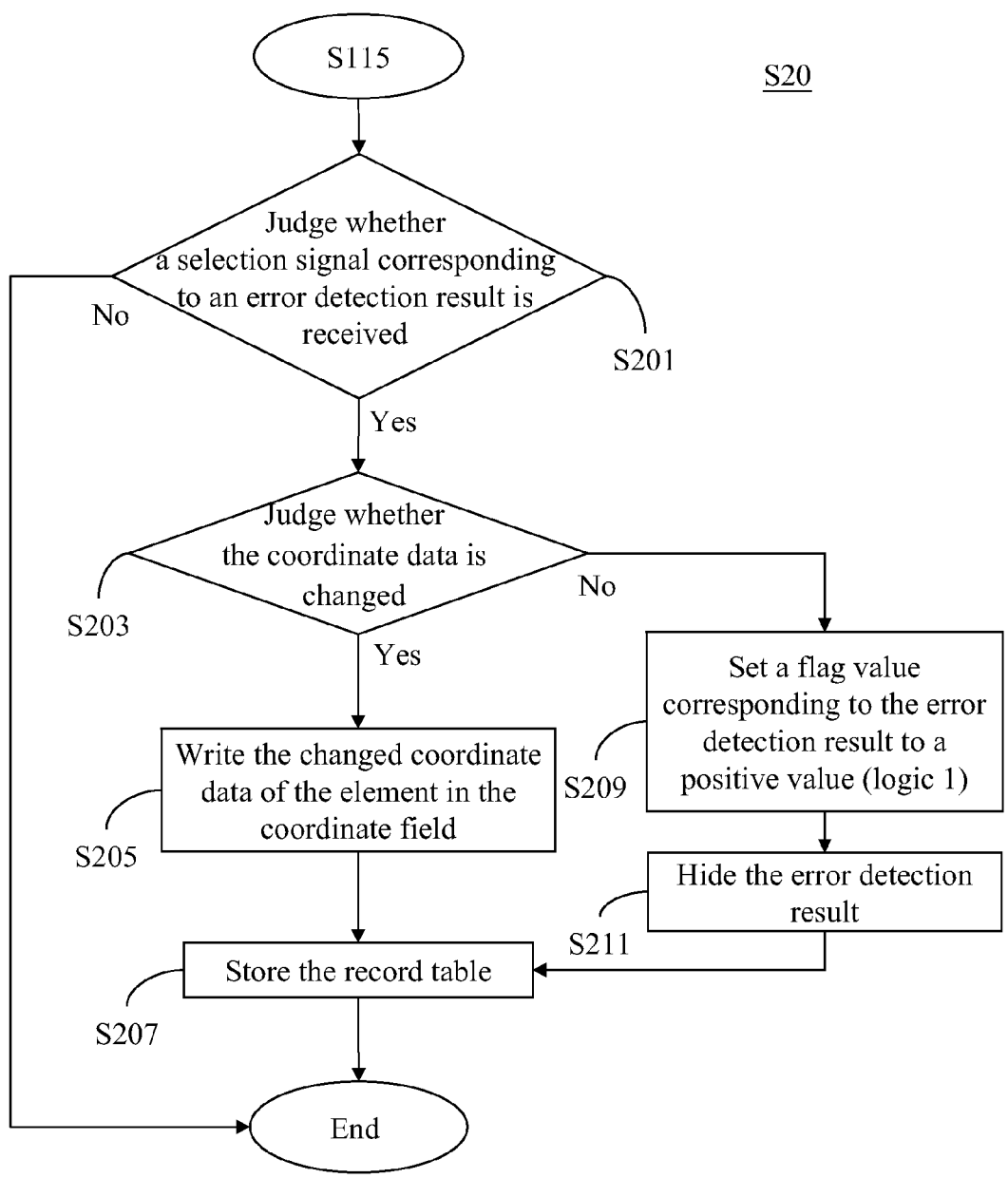
FIG. 2 is a flow chart of an error detection and correction procedure according to the present invention.

Referring to FIG. 2, it is a flow chart of an error detection and correction procedure according to the present invention. The flow chart shows a detailed flow of the error detection and correction procedure S20.

Step S201 immediately follows Step S115. In Step S201, it is judged whether a selection signal corresponding to an error detection result is received. At this time, the user may select an error detection result that he/she considers to be within the tolerable range. When a selection signal corresponding to the error detection result is received, it represents that the user intends to hide the error detection result to be not displayed on the screen. Thus, when the judgment result of Step S201 is true, Step S203 is performed. On the contrary, when the judgment result of Step S201 is false, the procedure ends.

In Step S203, it is judged whether the coordinate data of the error detection result (or the element) is changed. When the coordinate data of the element is not changed, Step S209 is performed.

In Step S209, a flag value corresponding to the error detection result is set to a positive value (logic 1). Moreover, in Step S211, the error detection result is hidden. Since the flag value corresponding to the error detection result is set to a positive value, when the step (S103) of scanning the layout file and the subsequent steps are performed the next time, the error detection result will be hidden.

On the other hand, when the result of Step S203 is judging that the coordinate data of the error detection result (or the element) is changed, Step S205 is performed. When the coordinate data of the error detection result (or the element) is changed, it represents that the element may exceed the tolerable range. Thus, in Step S205, the changed coordinate data of the element is written and stored in the coordinate column.

After Steps S205 and S211 are performed, Step S207 can be performed next.

In Step S207, the record table is stored. The record table will be read the next time scanning is performed.

The illustration is further given below with reference to an embodiment.

Referring to FIGS. 3A and 3D, they show an embodiment of the present invention.

The table in FIG. 3A represents the above record table. The record table records two batches of data, which represent a first error detection result and a second error detection result. In the first batch of data, the identification data stored in the identification column is "001", the coordinate data stored in the coordinate column is "(26,24)", and the flag value of the flag column is "0" (also representing a negative value or logic 0). In the second batch of data, the identification data stored in the identification column is "002", the coordinate data stored in the coordinate column is "(31,85)", and the flag value of the flag column is "0".

In FIG. 3B, a new third batch of data is obtained after the scanning of Step S103. The third batch of data represents a third error detection result. In the third batch of data, the identification data is "003", and the coordinate data is "(12, 51)". It is judged that the identification data does not exist in the original record table in Step S105, and thus Steps S107 to S111 are performed next, in which the identification data of the third batch of data is stored in the identification column, and the flag value corresponding to the error detection result is set to a negative value (logic 0).

In FIG. 3C, when the user intends to hide the first error detection result, the user selects the error detection result on the screen. When it is judged that a selection signal corresponding to the error detection result is received in Step S201, and when it is judged that the coordinate data of the element is not changed in Step S203, the flag value in the flag column corresponding to the first error detection result (identification data is "001") is set to "1" (also representing a positive value or logic 1).

In FIG. 3D, when the user modifies the coordinate data of the element, it is judged that the coordinate data of the element is changed in Step S203. Thus, Step S205 is performed next to store the changed coordinate data in the coordinate column.

With the above layout error detection method, error detection results within a tolerable range will be hidden. Therefore, the user will no longer see the marked parts on the picture of the screen, thus increasing the convenience in checking errors by the user.

What is claimed is:

1. A method for layout error detection, comprising:
    reading a layout file, wherein the layout file comprises a plurality of elements and a plurality of coordinate data, and each of the elements is corresponding to one of the coordinate data;
    reading a record table, wherein the record table comprises an identification column, a coordinate column, and a flag column;
    scanning the layout file to obtain an error detection result, wherein the error detection result is corresponding to an identification data and the coordinate data;
    searching the identification column of the record table to judge whether the identification column has the same identification data, and when a judgment result is false, performing the following steps:
        writing the identification data of the error detection result in the identification column;
        writing the coordinate data of the error detection result in the coordinate column;
        setting a flag value of the flag column corresponding to the error detection result to a negative value; and
        marking the error detection result; and
    scanning the layout file repeatedly until all the elements are scanned.

2. The method for layout error detection according to claim 1, wherein when the judgment result of searching the identification column of the record table to judge whether the identification column has the same identification data is true, the following step is performed:
    judging whether the flag value of the flag column corresponding to the error detection result is a positive value, and when a judgment result is false, marking the error detection result.

3. The method for layout error detection according to claim 2, wherein when the judgment result of judging whether the flag value of the flag column corresponding to the error detection result is the positive value, the error detection result is hidden.

4. The method for layout error detection according to claim 1, wherein an error detection and correction procedure is performed after all error detection results are obtained, and the error detection and correction procedure comprises the following steps:
    judging whether a selection signal corresponding to the error detection result is received, and when a judgment result is true, performing the following step:
        judging whether the coordinate data of the error detection result is changed, and when a judgment result is true, writing the changed coordinate data of the error detection result in the coordinate column.

5. The method for layout error detection according to claim 4, wherein after writing the changed coordinate data of the error detection result in the coordinate column, the method further comprises storing the record table.

6. The method for layout error detection according to claim 4, wherein when the judgment result of judging whether the coordinate data of the error detection result is changed is false, the coordinate column corresponding to the error detection result is set to a positive value, and the error detection result is hidden.

7. The method for layout error detection according to claim 6, wherein after setting the coordinate column corresponding to the error detection result to the positive value, the method further comprises storing the record table.

* * * * *